United States Patent [19]

Dalley et al.

[11] 4,217,634
[45] Aug. 12, 1980

[54] VOLTAGE AND CURRENT SOURCES

[75] Inventors: Robert J. Dalley, Yateley; Robert D. Owen, Farnborough, both of England

[73] Assignee: Sangamo Weston, Inc., Norcross, Ga.

[21] Appl. No.: 937,301

[22] Filed: Aug. 28, 1978

[30] Foreign Application Priority Data

Sep. 5, 1977 [GB] United Kingdom ............... 36918/77

[51] Int. Cl.² .......................................... H02M 7/02
[52] U.S. Cl. ..................................... 363/89; 324/119; 328/26; 340/210
[58] Field of Search ................ 307/260, 261; 324/119, 324/120; 328/26; 340/210; 363/19, 21, 23, 25, 26, 84, 86, 125, 126

[56] References Cited

U.S. PATENT DOCUMENTS

| | | | |
|---|---|---|---|
| 3,145,334 | 8/1964 | Berman | 363/25 |
| 3,478,256 | 11/1969 | Tomota | 363/23 |
| 3,596,165 | 7/1971 | Andrews | 363/19 |
| 3,947,747 | 3/1976 | Smith | 363/25 |

*Primary Examiner*—William M. Shoop

[57] ABSTRACT

A source for providing a voltage or current which is (remotely) controlled by a digital signal includes a digital-to-analogue converter (30) which supplies a proportion of a reference voltage ($V_R$) in accordance with the digital signal. The gain of an amplifier (48, 50) receiving an oscillatory signal is controlled by an error integrator (32) in dependence upon the difference between the converter output and a feedback signal derived via a precision rectifier (62) from a secondary winding (60) on a transformer (56), the primary (54) of which is coupled to the amplifier output, so the feedback signal tracks the converter output. Another (isolated) secondary winding (66) and precision rectifier (70) provide an output voltage equal to the feedback signal; the output voltage can be used to control a voltage-controlled current source (74). Although the output voltage or current is d.c. isolated, it tracks the reference voltage, so the source (14) can be coupled to the (floating) input circuitry (22a) of a digital voltmeter (22) and at the same time track the reference voltage in the separately-earthed analogue-to-digital converter (22b) of the voltmeter.

11 Claims, 3 Drawing Figures

VOLTAGE AND CURRENT SOURCES

This invention relates to voltage and current sources.

In remote data logging, there is sometimes a requirement for the magnitude of a voltage or current source to be preset remotely by a central data-logging station. For example, a platinum resistance thermometer is generally monitored by measuring the voltage developed across it by a predetermined constant current passing through it. Depending on the particular arrangement, pre-setting of the magnitude of the constant current provides zero-setting and/or sensitivity control of the thermometer. Thus, in the circumstances in which the platinum resistance thermometer and its constant current source are remote from the central data-logging station, it is convenient to have the current magnitude of the constant current source under the control of a signal supplied by the data-logging station.

According to this invention a voltage source for providing a d.c. voltage the magnitude of which is to be controlled by an input signal, comprises generating means arranged to respond to said input signal and to a feedback signal to generate an oscillatory signal having an amplitude dependent upon the difference between said input and feedback signals; coupling means having an input and a plurality of outputs and arranged to couple the oscillatory signal from said input to said outputs such that the amplitude of the signal at one output is in a predetermined ratio to the amplitude of the signal at another output and said one output is isolated against direct electrical contact from both said other output said input; and first and second rectifying means having substantially identical operating characteristics, the first rectifying means being arranged to receive the signal at said other output of the coupling means to derive said feedback signal and the second rectifying means being arranged to receive the signal at said one output to derive said d.c. output voltage.

The generating means may comprise integrating means arranged to respond to said input signal and said feedback signal to provide a control signal in accordance with the difference between said input and feedback signals, an oscillator, and variable-gain amplifying means arranged to amplify an output signal from the oscillator at a gain in accordance with said control signal. In these circumstances, the variable-gain amplifying means may comprise an amplifier coupled to said oscillator via variable impedance means the impedance of which is dependent upon said control signal. This variable impedance means may take the form of a light-emitting diode coupled to receive the control signal and arranged to illuminate a light-dependent resistive device coupling the oscillator to the amplifier.

Preferably the coupling means comprises a transformer in which a primary winding constitutes said input, and first and second secondary windings constitute respectively said other and said one outputs. The predetermined ratio (which in the case of said transformer is the turns ratio of said secondary windings) may be 1:1.

The coupling means may have three or more outputs, the third and any additional output being similar to said one output and having associated with it a respective rectifying means similar to the first and second rectifying means. The predetermined ratio between the signal at the said other output and the signal at the third or any additional output may or may not be 1:1, that is, it may be chosen to introduce a scale factor between the signal at said one output and the signal at said third or additional output.

This invention also provides a current source for providing a direct output current the magnitude of which is to be controlled by an input signal, comprising a voltage source as defined above, and voltage-controlled current supply means responsive to said d.c. output voltage derived by said second rectifying means.

In the case of both voltage and current sources, the input signal may be derived from a digital signal by a digital-to-analogue converter arranged to receive the digital signal and a reference voltage and to supply said input signal as a proportion of said reference voltage in accordance with the value of the digital signal. This arrangement is of particular advantage in the case of remote data logging, since it permits a remotely-preset constant current source to track a reference voltage used in, for example, a dual-slope or mark-space ratio analogue-to-digital converter in a voltmeter which is measuring voltages developed across resistances by the current supplied by the constant current source. Thus the effects of drift of this reference voltage are automatically compensated. The isolation provided by the said coupling means avoids problems that would otherewise arise in practice by virtue of the analogue-to-digital converter having a different earth connection from the input circuitry in the voltmeter (this circuitry being unavoidably electrically coupled to at least one terminal of the constant current source).

The digital-to-analogue converter may comprise a source of clock pulses, counter means for repetitively counting said clock pulses up to a predetermined full house count, comparator means arranged to compare the value of said digital signal with the count in said counter means and to couple said reference voltage to an output whenever said count is not greater than the value of said digital signal, and means for smoothing the signal at said output to provide said input signal.

The full house count may be equal to the maximum value of the digital signal. Alternatively, the full house count may be equal to the maximum value of the digital signal divided by an integral power other than 1 of the number base of the digital signal (for example, for a binary digital signal, an integral power of 2). In these latter circumstances, the comparator means would have a first portion receiving all the digits of the number counted by the counter means and the corresponding number of most significant digits of the digital signal, and a second portion receiving the remaining, lower-significance digits of the digital signal and the corresponding number of least significant digits from the counter means, the first portion of the comparator means being arranged to couple the reference voltage to the output as aforesaid directly, and the second portion being arranged to couple the reference voltage to the output via a resistive divider having a division ratio equal to the full house count of the counter means.

A current source according to this invention, which incorporates a voltage source also according to this invention and which is for use in a data logging system, will now be described, by way of example, with reference to the accompanying drawings, in which.

Figure 1:
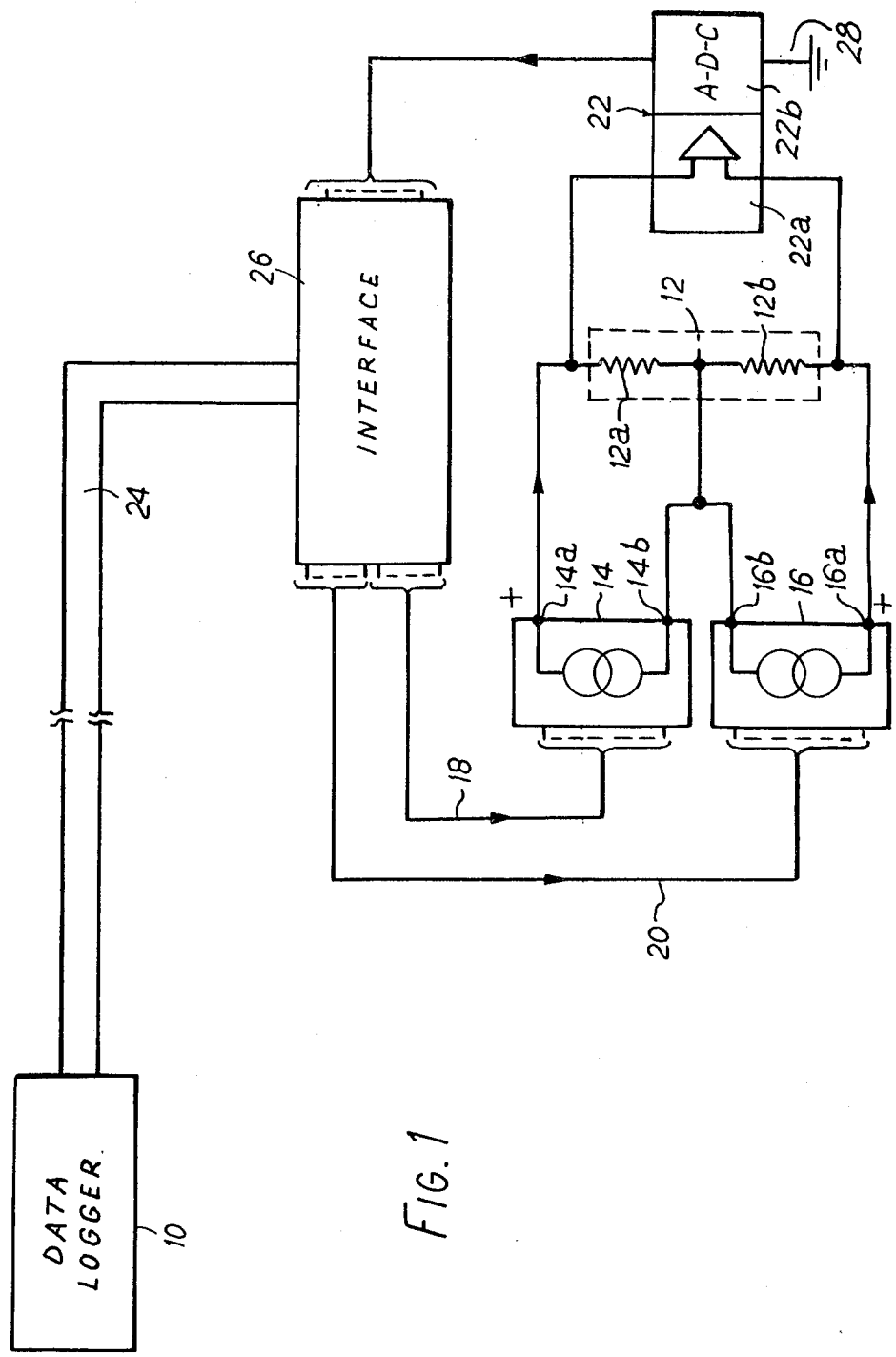
FIG. 1 is a block schematic diagram showing the system.

Referring to FIG. 1, there is shown a data logging system including a data logger 10 of conventional type for monitoring the temperature sensed by a platinum resistance thermometer 12 remote from the data logger 10. For greater sensitivity of measurement the platinum resistance thermometer 12 includes two platinum resistance elements 12a and 12b in series, one of which (12a) is held at a reference temperature and the other of which (12b) is exposed to the temperature to be measured. Two current sources 14 and 16 are coupled in series opposition, with their positive terminals 14a, 16a connected to the free ends of the resistance elements 12a and 12b respectively, and their joined negative terminals 14b, 16b coupled to the junction of the resistance elements 12a and 12b. These current sources 14 and 16 are controllable (also known as programmable) to provide preset current magnitudes in accordance with digital commands suppled via input lines 18 and 20 respectively.

The net voltage across the two resistance elements 12a and 12b is measured by a conventional digital voltmeter 22, comprising, essentially, an input amplifier 22a and an analogue-to-digital converter 22b.

The digital commands for the current sources 14 and 16 and the digital measurements of the voltmeter 22 are communicated from and to the data logger 10 via a two-wire link 24 which is operated in a time-division multiplex mode. De-multiplexing of the commands and multiplexing of the measurements is effected in known manner by an interface circuit 26 coupling the lines 18 and 20 and the voltmeter 22 to the link 24.

In practice, several platinum resistance thermometers 12 would be associated with the current sources 14 and 16, the digital voltmeter 22 and the interface 26, which would include a scanner unit for sequentially coupling each resistance thermometer to the current sources 14 and 16 and the digital voltmeter 22. However, only one resistance thermometer 12 has been shown in FIG. 1 for clarity.

In operation, the two resistance elements 12a and 12b are initially both held at the reference temperature, and the data logger 10 monitors the measurements of the digital voltmeter 22 while remotely adjusting the current magnitudes of the current sources 14 and 16 by varying their respective digital commands. In this respect, the current source 14 controls the sensitivity of the resistance thermometer 12 (by controlling the magnitude of the voltage developed across the resistance element 12a, and indirectly that of the voltage across the resistance element 12b, at the reference temperature), and the current source 16 controls the zero-setting of the resistance thermometer 12 (by equalising the voltage developed across the element 12b with that developed across the element 12a) to obtain a null reading on the digital voltmeter 22. As the element 12b thereafter follows the temperature to be measured, its resistance, and thus the voltage developed across it, vary. These variations are measured by the digital voltmeter 22 to provide the desired indication of temperature.

The operation of the analogue-to-digital converter 22b may take several forms (see, for example, British Patent Nos. 869,262, 950,647, 1,220,091 and 1,434,414), but basically involves comparison of the voltage to be measured with a reference voltage. Thus the accuracy of the measurements depends in part on the stability of this reference voltage. However, if the current magnitudes of the current sources 14 and 16 can be made to change by the same proportion as any changes in the reference voltage, the voltage to be measured will also change by that proportion, thus cancelling out inaccuracies that would otherwise result from such changes in the reference voltage.

In a practical digital voltmeter 22, the input amplifier 22a has a common (LO) supply rail which floats relative to the earth connection 28 of the analogue-to-digital converter 22b. It can be seen in FIG. 1 that the current sources 14 and 16 must be directly coupled to the input amplifier 22a. Thus, it is necessary to make the current sources 14 and 16 track changes in the reference voltage of the analogue-to-digital converter 22b while preserving the d.c. isolation of the input amplifier 22a (and the sources 14 and 16) relative to the converter 22b.

Figure 2:
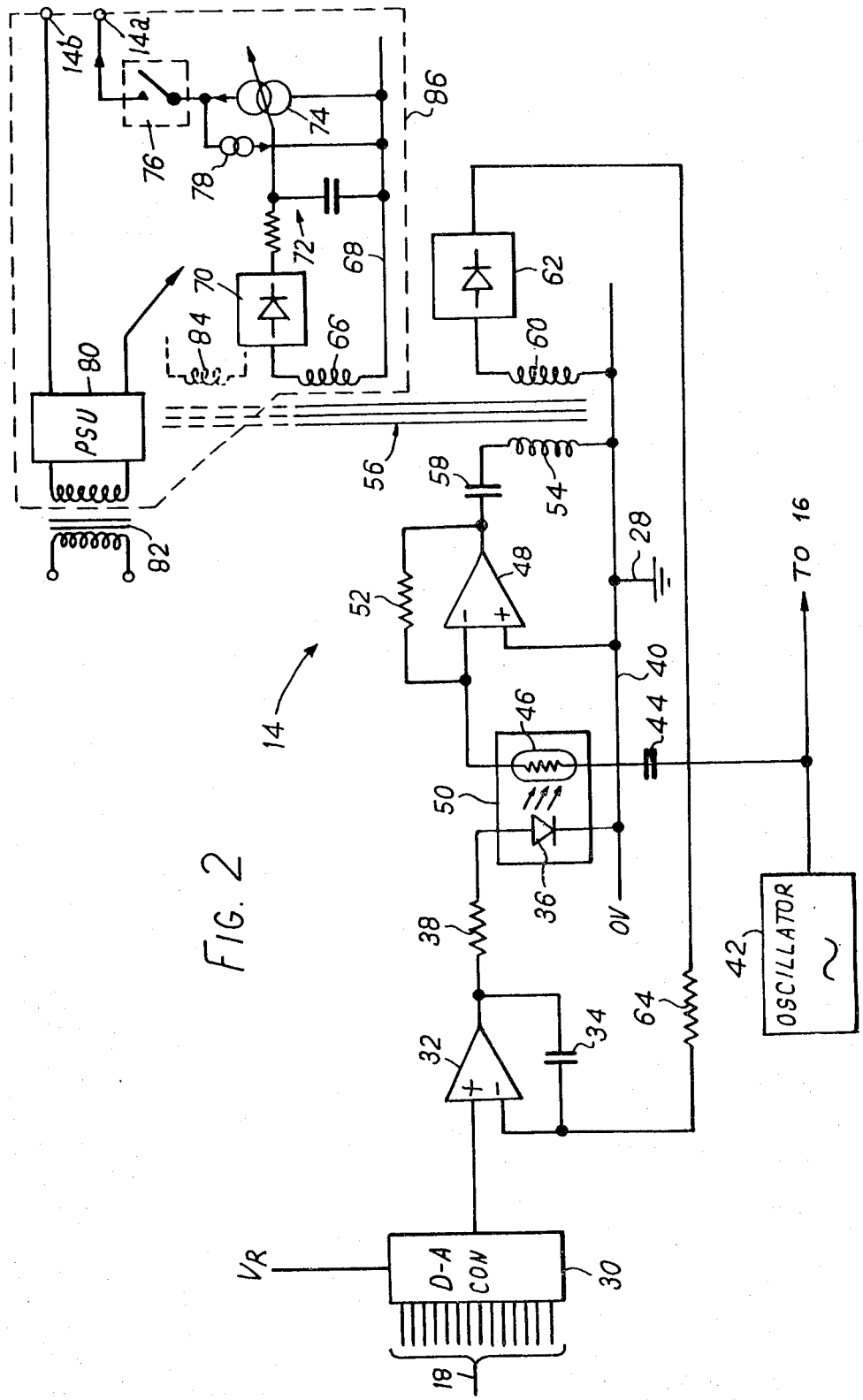
FIG. 2 is a circuit diagram of the current source.

FIG. 2 shows a circuit for the current source 14 which achieves this objective—the current source 16 is the same, but shares some circuitry as will be described hereinafter.

Referring to FIG. 2, the input line 18 supplies a 14-bit digital signal to a digital-to-analogue converter 30 which also receives the reference voltage $V_R$ of the analogue-to-digital converter 22b in the digital voltmeter 22. The analogue output signal of the converter 30 is proportional to the reference voltage $V_R$, the magnitude of the proportion depending on the value of the 14-bit digital signal, and is supplied to the non-inverting input of a high-gain amplifier 32. The output of the amplifier 32 is coupled to its inverting input by a feedback capacitor 34, so that the amplifier 32 forms an error integrator, and also drives a light-emitting diode 36 via a resistor 38. The end of the diode 36 remote from the resistor 38 is connected to a 0V rail 40 which is grounded via the earth connection 28 of the analogue-to-digital converter 22b.

An oscillator 42 supplies a sine-wave signal at a frequency of about 30 kHz via a capacitor 44 and a light-dependent resistor 46 to the inverting input of a high-gain amplifier 48. The light-dependent resistor 46 is mounted alongside the light-emitting diode 36 in a light-proof enclosure 50 so that the resistance of the light-dependent resistor 46 depends solely on the intensity of illumination of, and therefore on the current flowing through, the light-emitting diode 36.

The non-inverting input of the amplifier 48 is grounded via the rail 40. The output of the amplifier 48 is coupled to the inverting input by a feedback resistor 52, and, via a capacitor 58, to one lead of a primary winding 54 of a transformer 56. The other lead of the primary winding 54 is grounded via the rail 40.

A first secondary winding 60 of the transformer 56 is coupled between the rail 40 and a precision rectifier 62 which is itself coupled via a resistor 64 to the inverting input of the error-integrator amplifier 32.

The transformer 56 has a second secondary winding 66, which in this case has the same number of turns as the first secondary winding 60, and which is coupled between a floating 0V rail 68 and another precision rectifier 70 having the same design and operating characteristics as the precision rectifier 62. The output of the precision rectifier 70 is coupled via a smoothing circuit 72 to the control input of a voltage-controlled current source 74.

The precision rectifiers 62 and 70 and the current source 74 are in themselves conventional, well-known circuits and need not be described here in detail.

One output terminal of the current source 74 is connected to the floating 0V rail 68, and the other output terminal is coupled by an isolated electronic switch 76 (for example, a thyristor controlled via an optical coupling device) to one of the current supply terminals 14a of the current source 14. An auxiliary constant-current source 78 also supplies current, of opposite sense to that from the source 74, via the switch 76 to the terminal 14a. The terminal 14b is coupled to a power supply unit 80 which receives a.c. power via an isolating transformer 82 and supplies smoothed d.c. power at various voltages to the current sources 74 and 78 and to associated protective and control circuits which have been omitted from FIG. 2. for clarity.

In operation, the data logger 10 supplies a digital command via the line 24 and the interface 26 to the line 18 in accordance with the current magnitude to be supplied by the current source 14. The converter 30 derives a voltage $V_i$ from the reference voltage $V_R$ in accordance with the value of the digital command. As will be explained later, the converter 30 also incorporates a small offset voltage $V_S$ in the voltage $V_i$. Thus $$V_i = C.V_R + V_S$$

where C represents the value of the digital command.

The amplifier 32 provides a control signal representative of the difference between the voltage $V_i$ and the feedback voltage $V_f$ derived by the precision rectifier 62. This control signal determines the brightness of the light-emitting diode 36, and therefore the resistance of the light-dependent resistor 46, which in turn determines the amplitude of the oscillations coupled by the resistor 46 from the oscillator 42 to the amplifier 48. The net amplitude of the oscillations at the output of the amplifier 48 thus depends on the variable resistance of the resistor 46 and the constant gain of the amplifier 48, which together with the resistor 46 forms a variable-gain amplifying circuit.

The oscillations at the output of the amplifier 48 are coupled by the transformer 56 to the first secondary winding 60 and the precision rectifier 62 which rectifies them to produce the feedback voltage $V_f$.

Thus the error integrator amplifier 32 can vary the feedback voltage $V_f$, by varying the control signal at its output, to maintain the feedback voltage $V_f$ substantially equal to the voltage $V_i$, so that $$V_f = V_i$$

Furthermore, as noted above, the secondary windings 60 and 66 have the same number of turns and the precision rectifiers 62 and 70 have substantially identical operating characteristics. Thus, the voltage $V_o$ at the output of the precision rectifier 70 equals the feedback voltage $V_f$.

$$V_o = V_f = V_i$$

The voltage-controlled current source 74 produces a current related to its control-input voltage by a constant factor K:

$$I_o = K.V_o$$

and the total output current $I_T$ of the current source 14 is this current minus the current $I_S$ of the source 78:

$$I_T = I_o - I_S$$

Consequently, $$I_T = K.V_o - I_S = K.V_i - I_S = K(C.V_R + V_S) - I_S$$

The offset voltage $V_S$ is preset to equal $I_S/K$, so that $$I_T = KCV_R$$

and the output current is dependent upon the digital command C and tracks the reference voltage $V_R$, as required.

The offset voltage $V_S$ and the compensating current $I_S$ are included to ensure that there is always some signal present in the feedback loop, thus avoiding problems of non-linearity of the precision rectifiers 62 and 70.

In the particular application to use with platinum-resistance thermometers described above, each current source 14 and 16 needs only one output, as shown in FIG. 2. However, in some circumstances it may be desirable to have several outputs. As shown in FIG. 2 in dashed outline, this can be readily accomplished by adding additional secondary windings 84 to the transformer 56, with associated precision rectifiers, smoothing circuits and current sources. If all the outputs are to have equal current magnitudes, their associated secondary windings have equal numbers of turns. Alternatively, different secondary windings may have different numbers of turns to provide outputs which track one another at constant current-magnitude ratios.

It can be seen from FIG. 2 that there is no direct electrical connection between the circuitry 86 enclosed in the dotted line and the remainder of the current source 14. The transformers 56 and 82 provide full isolation of this circuitry 86, so that the rails 40 and 68 can be connected to different earth points, while still permitting the current magnitude (relative to the rail 68) to track the reference voltage $V_R$ (relative to the rail 40).

If the current source 14 is provided with several outputs as discussed above, these can also be fully isolated from each other by providing each with a respective secondary winding on the power supply transformer 82.

It will be apparent that an isolated controllable voltage source can be provided simply by omitting the voltage-controlled current source 74 and taking the voltage from the precision rectifier 70, via smoothing circuit 72, as the output of the voltage source.

Figure 3:
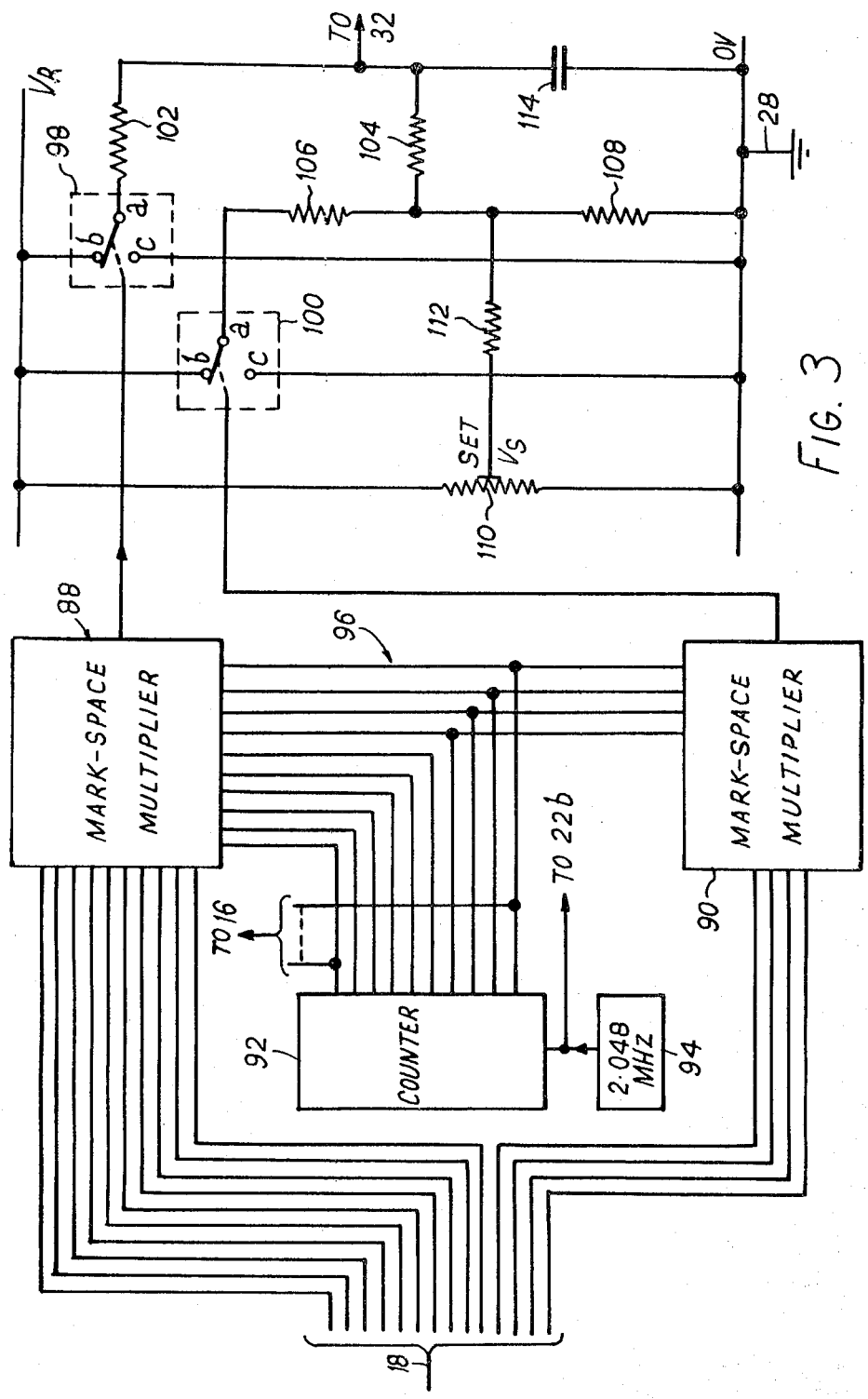
FIG. 3 is a circuit diagram of a digital-to-analogue converter forming part of the source.

A circuit for the digital-to-analogue converter 30 is shown in FIG. 3.

Referring to FIG. 3, the ten most significant bits of the 14 bit digital command on the line 18 are supplied to a first mark-space multiplier 88, and the remaining four, lower-significance bits are supplied to a second mark-space multiplier 90. A ten-stage binary counter 92 receives clock pulses at a frequency of 2.048 MHz from a generator 94, and supplies a 10-bit signal representative of its current count on lines 96 to the multiplier 88. In addition, the four least-significant bits of the count signal are supplied to the multiplier 90.

The multipliers 88 and 90 operate respective electronic switches 98 and 100 to connect a common contact 98a, 100a either to the reference voltage $V_R$ contacts 98b, 100b, or to the earth connection 28 via contacts 98c, 100c. The common contact 98a is coupled via a resistor 102 to the output of the converter 30, which is connected to the non-inverting input of the amplifier 32 (FIG. 2). The common contact 100a is also coupled, via a resistor 104, to the converter output, but through a voltage divider comprising resistors 106 and 108 which have values in the ratio 1023:1—that is, the voltage supplied via the resistor 104 is $V_R/1024$.

The resistor 104 also supplies to the output the offset voltage $V_S$ derived from a variable resistor 110 which is connected between the reference voltage $V_R$ and the earth connection 28, and which has its wiper coupled to the resistor 104 via a resistor 112. A smoothing capacitor 114 is connected between the converter output and the earth connection 28.

In operation, the counter 92 counts repetitively from 0 to 1023, completing one counting cycle in 0.5 milliseconds. As long as the count in each cycle is less than or equal to the binary number represented by the 10 most-significant digits of the digital command that are received by the multiplier 88, that multiplier 88 maintains the switch 98 in the state shown in FIG. 3 to couple the reference voltage $V_R$ to the converter output. When the count becomes greater than this binary number, the switch 98 changes state to couple 0V to the converter output for the rest of that counting cycle. The resulting pulses at the output, of magnitude $V_R$ and duration representative of the value of this 10-bit binary number, are averaged by the smoothing capacitor to give an average magnitude representative of the value of the binary number and of $V_R$.

Similarly, the multiplier 90 causes the switch 100 to supply the reference voltage when the four least-significant digits of the counter output represent a binary number less than or equal to the binary number represented by the four lower-significance digits of the digital command on the line 18. The pulses from the switch 100 are averaged and summed (but with a weighting of 1/1024) with those from the switch 98, and with the voltage $V_S$, to provide the analogue output signal equivalent to the digital command.

The 14-bit digital command could be supplied to a single mark-space multiplier, with the counter 92 having 14 stages. However, the analogue output signal would then have a ripple component at a frequency of 125 Hz. The analogue-to-digital converter 22b operates, in part, by counting clock pulses gated for a period or periods the total duration of which, relative to a fixed, longer 'conversion interval' is dependent on the magnitude of the analogue input signal. The clock pulses are conveniently those generated by the generator 94. The effect of the 125 Hz ripple could be eliminated by making the conversion interval equal in duration to an integral number of cycles of the ripple. However, this would impose a very slow conversion rate on the voltmeter 22. Counteracting this by raising the frequency of the clock pulses would be very difficult with present counting technology.

These problems are overcome in the converter in FIG. 3 by using the two multipliers 88 and 90, so that the counter 92 only has to count up to 1024 instead of 16,384, giving rise to a ripple frequency of 2 kHz. This ripple frequency permits compensation by making all the conversion intervals of the voltmeter 22 integral multiples of 0.5 milliseconds, without imposing too low a conversion rate. Using the four least-significant digits of the counter 92 for both multipliers in this way produces an excessively high output voltage at the terminal 100a of the switch 100, but this is compensated by the weighting introduced by the voltage-divider resistors 106 and 108.

The digital-to-analogue converter shown in FIG. 3 has the advantage that it is monotonic (there is one and only one value of the analogue output signal for each value of digital input signal), and it gives 14-bit resolution more economically than would, for example, a resistor ladder-network type of converter.

Since the two current sources 14 and 16 must be separately controllable, they must, in the main, have separate circuitry. However, they can share a single oscillator 42 and a single counter 92.

We claim:

1. A voltage source for providing a d.c. output voltage the magnitude of which is to be controlled by an input signal comprising generating means arranged to respond to said input signal and to a feedback signal to generate an oscillatory signal having an amplitude dependent upon the difference between said input and feedback signals; coupling means having an input responsive to said generating means and a plurality of outputs and arranged to couple the oscillatory signal from said input to said outputs such that the amplitude of the signal at one output is in a predetermined ratio to the amplitude of the signal at another output and said one output is isolated against direct electrical contact from both said other output and said input; and first and second rectifying means having substantially identical operating characteristics, the first rectifying means being arranged to receive the signal at said other output of the coupling means to derive said feedback signal and the second rectifying means being arranged to receive the signal at said one output to derive said d.c. output voltage.

2. A voltage source according to claim 1, wherein the generating means comprises integrating means arranged to respond to said input signal and said feedback signal to provide a control signal in accordance with the difference between said input and feedback signals, an oscillator, and variable-gain amplifying means responsive to said integrating means and said oscillator to amplify an output signal from the oscillator at a gain in accordance with said control signal.

3. A voltage source according to claim 2, wherein the variable-gain amplifying means comprises an amplifier coupled to said oscillator via variable impedance means the impedance of which is dependent upon said control signal.

4. A voltage source according to claim 3, wherein the variable impedance means comprises a light-emitting diode coupled to receive the control signal and arranged to illuminate a light-dependent resistive device coupling the oscillator to the amplifier.

5. A voltage source according to claims 1, 2, 3 or 4, wherein the coupling means comprises a transformer having a primary winding which constitutes said input, and first and second secondary windings which constitute respectively said other and said one outputs.

6. A voltage source according to claim 1, wherein the coupling means has more than two outputs, each additional output being similar to said one output and having associated with it a respective rectifying means similar to the first and second rectifying means.

7. A current source for providing a direct output current the magnitude of which is to be controlled by an input signal, comprising a voltage source according to claim 1 and voltage-controlled current supply means responsive to said d.c. output voltage derived by said second rectifying means.

8. A source according to claims 1 or 7, wherein the input signal is derived from a digital signal by a digital-to-analogue converter arranged to receive the digital signal and a reference voltage and to supply said input signal as a proportion of said reference voltage in accordance with the value of the digital signal.

9. A source according to claim 8, wherein the digital-to-analogue converter comprises a source of clock pulses, counter means for repetitively counting said clock pulses up to a predetermined full house count, comparator means arranged to compare the value of said digital signal with the count of said counter and to couple said reference voltage to an output whenever said count is not greater than the value of said digital signal, and means for smoothing the signal at said output to provide said input signal.

10. A source according to claim 9, wherein the full house count is equal to the maximum value of the digital signal.

11. A source according to claim 9, wherein the full house count is equal to the maximum value of the digital signal divided by an integral power other than 1 of the number base of the digital signal, and the comparator means has a first portion receiving all the digits of the number counted by the counter means and the corresponding number of most significant digits of the digital signal, and a second portion receiving the remaining, lower-significance digits of the digital signal and the corresponding number of least sigificant digits from the counter means, the first portion of the comparator means being arranged to couple the reference voltage to the output directly, and the second portion being arranged to couple the reference voltage to the output via a resistive divider having a division ratio equal to the full house count of the counter means.

* * * * *

UNITED STATES PATENT AND TRADEMARK OFFICE
CERTIFICATE OF CORRECTION

PATENT NO. : 4,217,634

DATED : 8-12-80

INVENTOR(S) : Robert J. Dalley & Robert D. Owen

It is certified that error appears in the above-identified patent and that said Letters Patent are hereby corrected as shown below:

Assignment Data: -- The Solartron Electronic Group Limited, Hampshire, England. --

Column 1, line 33 insert -- and -- between "output" and "said".

Column 2, line 25, "otherewise" should read -- otherwise --.

Column 5, line 54 "$V_f.$" should read -- $V_f:$ --.

Column 6, line 20 insert -- separate -- between "several" and "outputs".

Signed and Sealed this

Twenty-fourth Day of February 1981

[SEAL]

Attest:

RENE D. TEGTMEYER

Attesting Officer

Acting Commissioner of Patents and Trademarks